(12) United States Patent
Kim et al.

(10) Patent No.: US 6,411,551 B1
(45) Date of Patent: Jun. 25, 2002

(54) MULTI-STATE NONVOLATILE SEMICONDUCTOR MEMORY DEVICE WHICH IS CAPABLE OF REGULARLY MAINTAINING A MARGIN BETWEEN THRESHOLD VOLTAGE DISTRIBUTIONS

(75) Inventors: Dong-Hwan Kim, Seoul; Seok-Cheon Kwon, Kyunggi-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/703,190

(22) Filed: Oct. 31, 2000

(30) Foreign Application Priority Data

Nov. 1, 1999 (KR) .............................................. 99-47959

(51) Int. Cl.[7] .............................................. G11C 11/34
(52) U.S. Cl. ................................ 365/185.24; 365/185.18
(58) Field of Search .......................... 365/185.24, 185.18

(56) References Cited

U.S. PATENT DOCUMENTS 5,724,284 A * 3/1998 Bill et al. ................. 365/185.2

* cited by examiner

Primary Examiner—David Nelms
Assistant Examiner—M. Tran
(74) Attorney, Agent, or Firm—Marger Johnson & McCollom, P.C.

(57) ABSTRACT

A nonvolatile semiconductor memory device of the present invention has an array that includes a bit line, a plurality of word lines arranged perpendicularly to the bit line and a plurality of memory cells each arranged at intersections of the bit line and the word lines. In the nonvolatile semiconductor memory device is further provided a storage circuit and a program data judging circuit. The storage circuit has at least two latches each of which is connected to a corresponding input/output line and latches data. The program data judging circuit judges whether logic states of data latched in the latches indicate a programming or a program-inhibition of a selected memory cell, and sets the bit line to a program voltage or a program inhibition voltage according to a judgment result.

9 Claims, 11 Drawing Sheets

MULTI-STATE NONVOLATILE SEMICONDUCTOR MEMORY DEVICE WHICH IS CAPABLE OF REGULARLY MAINTAINING A MARGIN BETWEEN THRESHOLD VOLTAGE DISTRIBUTIONS

This application relies from priority upon Korean Patent Application No. 1999-47959, filed on Nov. 1, 1999, the contents of which are herein incorporated by reference in their entirety.

FIELD OF THE INVENTION

The present invention is related to semiconductors memory devices, and more particularly to a nonvolatile semiconductor memory device, which stores information of plural bits per cell.

BACKGROUND OF THE INVENTION

Non-volatile integrated circuit memory devices can be classified into the following categories: mask ROMs; EPROMs; EEPROMs; and flash-EEPROMs. Among these memory devices, flash-EEPROMs have recently been discussed as permanent memories for personal computers in that they can achieve an electrical conversion of information while erasing stored data in a flash.

In conventional non-volatile memory devices, memory cells can take one of two information storing states, namely, the "ON" state and "OFF" state. One bit of information is defined by the ON or OFF state of a respective memory cell. In order to store data of N bits (N: a natural number of 2 or greater) in the conventional memory devices mentioned above, N independent memory cells are necessary. When it is required to increase the number of bits of data to be stored in a memory device having one-bit memory cells, the number of such memory cells should increase correspondingly.

Information stored in a conventional one-bit memory cell is determined by the programmed status of the memory cell where programming is used to store the desired information in the memory cell. The information storing state of the memory cell is determined by the threshold voltage which is a minimum voltage to be applied between the gate and source terminals of the transistor included in the memory cell in order to switch the cell transistor to its ON state. In other words, memory cells have different information storing states in accordance with different threshold voltages thereof. In the case of EPROMs, EEPROMs, and flash-EEPROMs, a difference in the threshold voltage for cell transistors is obtained by storing different amounts of charge in the floating gates of the memory cells.

In particular, each memory cell transistor has two gates including upper and lower layers laminated on a channel region between source and drain regions. The upper gate is called a control gate. A charge storage portion is surrounded by an insulating material between the control gate and the channel region. This charge storage portion is called a floating gate. Accordingly, the state of information stored in each memory cell can be distinguished by the threshold voltage of that memory cell.

In order to read information stored in the memory cells of a memory device, it is necessary to check the information storing state of the programmed memory cells. To this end, signals required to read state information from a selected memory cell are applied to circuits associated with the selected memory cell by use of a decoder circuit. As a result, a current or voltage signal indicative of the stored information of the memory cell can be obtained on a bit line. In this way, the programmed information of a memory cell can be found by measuring the obtained current or voltage signal.

These memory devices can have a NOR-type or a NAND-type memory cell array structure depending on the connection of the memory cells to respective bit lines. In a NOR-type memory cell array, each memory cell is connected between a bit line and a ground line. In a NAND-type memory cell array, a plurality of memory cells are connected in series between a bit line and a ground line. A group of memory cells connected in series to one bit line along with selection transistors used to select those memory cells is called a string. The selection transistors may include a first transistor (or a string select transistor) arranged between the series-connected memory cells and the associated bit line, and a second transistor (or a ground select transistor) arranged between the series-connected memory cells and a ground line.

When reading information stored in a NAND-type memory device, a selected transistor in a selected string is switched to the ON state. In addition, a voltage higher than that applied to the control gate of the selected memory cell is applied to the control gates of unselected memory cells. As a result, the unselected memory cells have a low equivalent resistance as compared to the selected memory cell. The magnitude of the current flowing through the string from the associated bit line thus depends on the information stored in the selected memory cell of the string. The voltage or current corresponding to the information stored in each selected memory cell is sensed by a sensing circuit which is generally known as a sense amplifier.

Many schemes have been proposed to increase the information storage capacity of memory devices without involving an increase in chip size. For example, information of at least two bits can be stored in each memory cell. Conventionally, a memory cell stores only one bit of information therein. However, when 2 bits of information are stored in one memory cell, this memory cell is programmed with either "00", "01", "10" or "11". Accordingly, a memory device can store twice the information with the same number of memory cells as compared to a memory device wherein only one bit is stored in a memory cell. When storing 2 bits per memory cell, a multi-state memory device is provided wherein the threshold voltage of each memory cell can be programmed to have one of four different values. Because the memory capacity per memory cell is doubled, the chip size can be reduced while providing the same memory capacity. As the number of bits stored per memory cell increases, the data storage capacity of the multi-state memory device increases.

Figure 1:
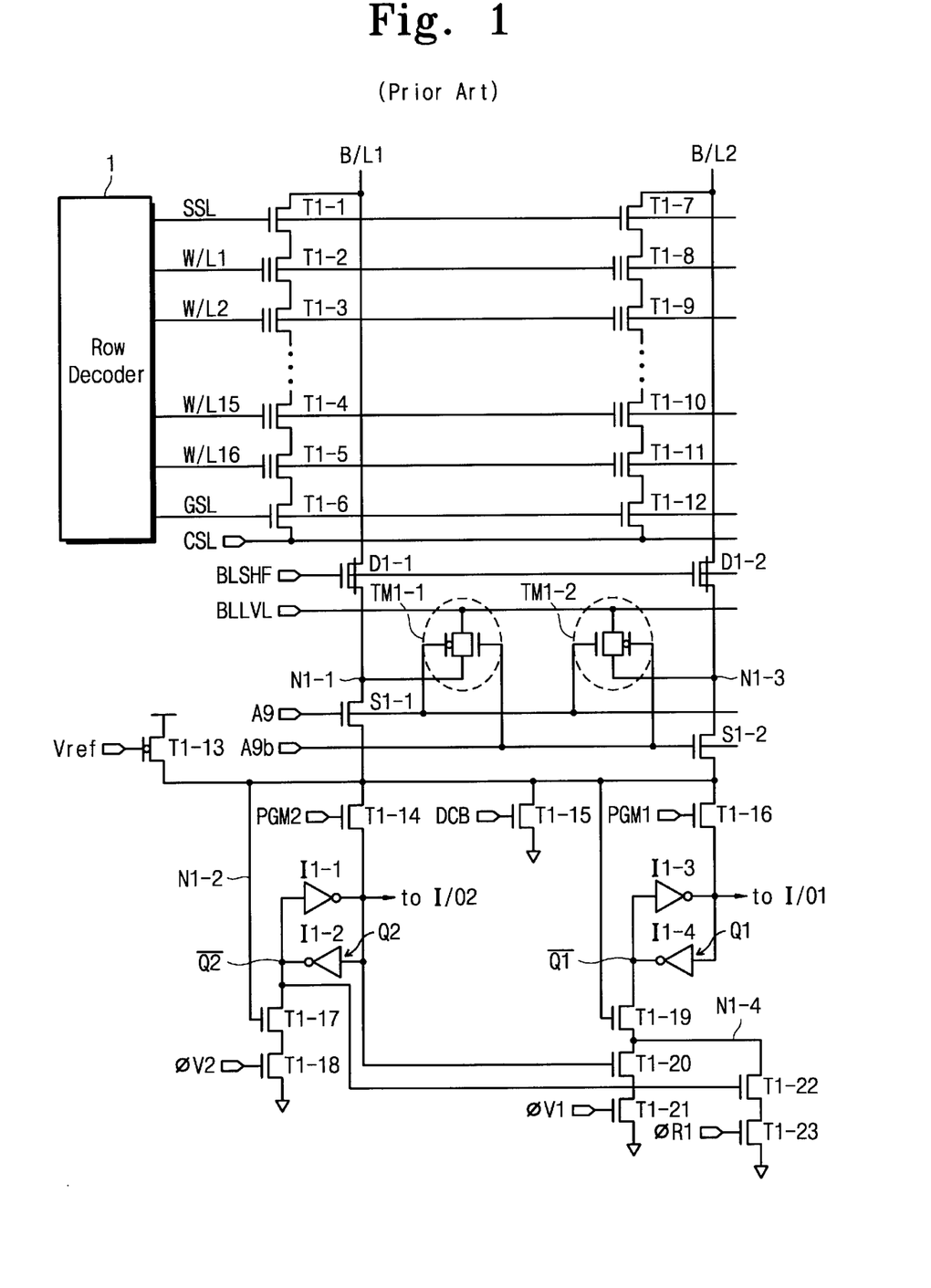
FIG. 1 shows a nonvolatile semiconductor memory device according to the prior art.

FIG. 1 is a circuit diagram showing a conventional memory device wherein two bits of information per memory cell are stored using a NAND-type flash-EEPROM cells. The memory device in FIG. 1 is disclosed in U.S. Pat. No. 5,768,188 under the title of "MULTI-STATE NON-VOLATILE SEMICONDUCTOR MEMORY AND METHOD FOR DRIVING THE SAME", which is herein incorporated by reference.

The memory device disclosed in the '188 patent includes two memory cell strings each having a plurality of series-connected memory cells. Two bit lines, associated with respective memory cell strings, are illustrated wherein these bit lines belong to different groups. As will be understood by one having skill in the art, larger numbers of memory cell strings and respective bit lines can be used. In FIG. 1, the memory cells of each string are labeled T1-2 to T1-5 or T1-8 to T1-11, respectively. A selection transistor, T1-1 or T1-7, is coupled between each string and the associated bit line. The selection transistor is selectively switched on to couple the associated string and bit line together. Another selection transistor, T1-6 or T1-12, is arranged between each string and a common source line CSL to selectively switch the connection between the string and common source line CSL. A depletion transistor, D1-1 or D1-2, is also coupled to each bit line to inhibit an application of high voltage.

A bit line selection transistor, S1-1 or S1-2, is also connected to each bit line. Each bit line selection transistor selects a respective bit line in response to a bit line selection signal, A9 or A9b. A signal line BLLVL is connected to each of the bit lines via transmission transistors TM1-1 and TM1-2. Each transmission transistor applies a signal BLLVL from the signal line BLLVL to the associated bit line in response to the bit line selection signals A9 and A9b applied thereto when the bit line is not selected. The signal BLLVL supplies a program inhibit voltage (for example, the supply voltage Vcc) to the unselected bit line during programming and reading operations while floating during the erase operation. A transistor T1-13 is also connected to the bit lines to supply static current to the selected bit line during the read operation. The memory device of FIG. 1 also includes latch-type sense amplifiers I1-1 and I1-2 (or I1-3 and I1-4) associated with each bit line. The sense amplifiers latch externally applied data during the programming operation, supply a voltage corresponding to the latched data to the associated bit line, and latch the data read during the read operation.

A plurality of transistors T1-17, T1-1 8, T1-19, T1-20, T1-21, T1-22 and T1-23 are provided, and these transistors invert or maintain latch states of the sense amplifiers in accordance with a bit line level selected during the reading operation. This function is controlled by latch enable signals φV2, φV1 and φR1. These latch enable signals are enabled in the form of a pulse at the point in time when an inversion in latch state is required after a predetermined time has elapsed since the beginning of the reading operation. A transistor T1-15 is also connected to the bit lines. The transistor T1-15 initializes the latches just before the execution of the read operation while maintaining the bit lines at a ground voltage state. The transistor T1-15 is controlled by a signal DCB. Transistors T1-14 and T1-16 are coupled to respective bit lines. These transistors T1-14 and T1-16 turn on when the programming operation is executed, thereby transmitting the latched data to the respective bit lines. The transistors T1-14 and T1-16 are respectively controlled by control signals PGM1 and PGM2.

Figure 2:
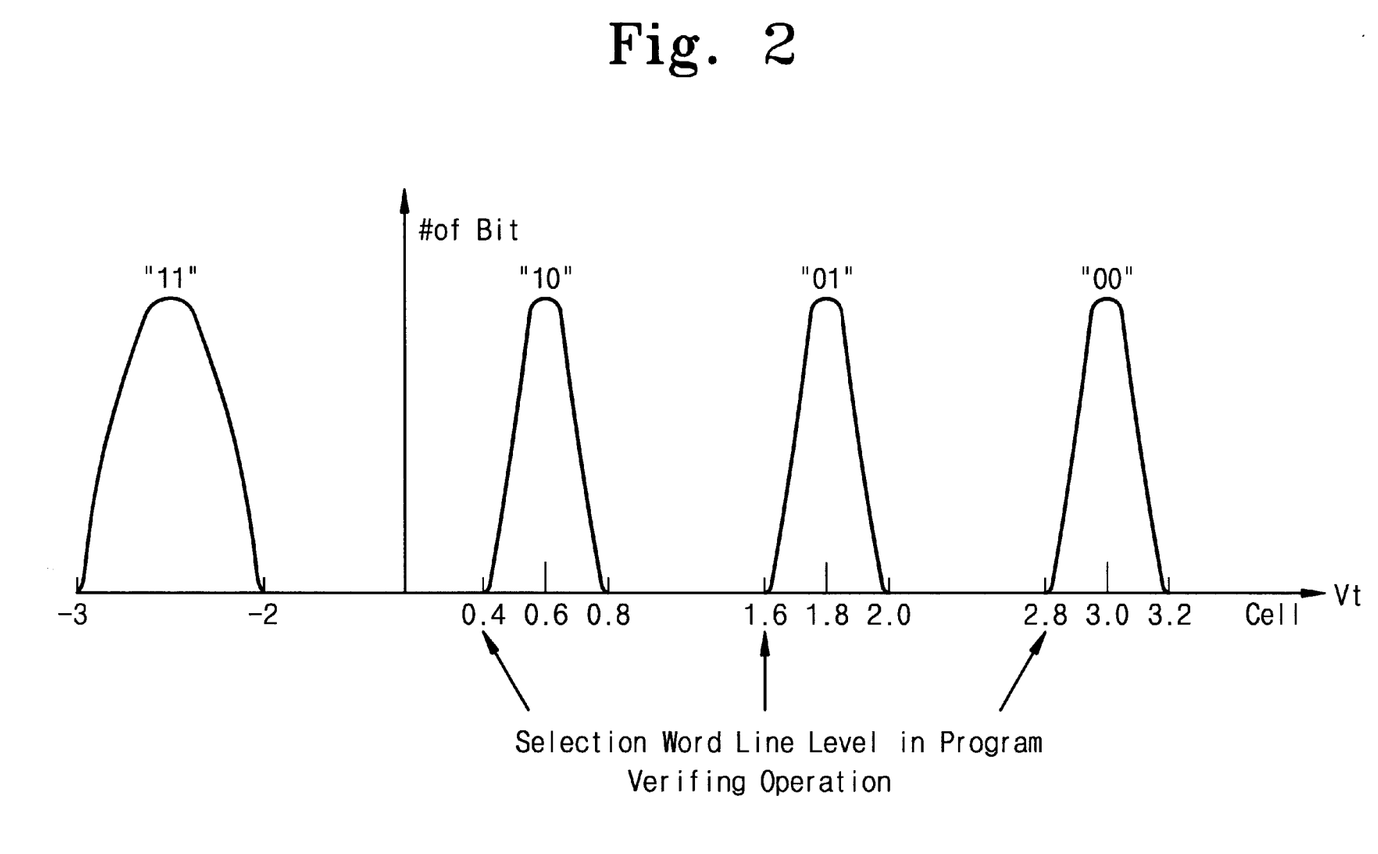
FIG. 2 shows a threshold voltage distribution of a memory cell according to programmed data.

FIG. 2 shows a threshold voltage distribution of a memory cell according to programmed data. As shown in FIG. 2, a programmed memory cell has one of a threshold voltage distribution (indicating 2-bit data of "11") lower than −2.0V, a threshold voltage distribution (indicating 2-bit data of "10") between 0.4V to 0.8V, a threshold voltage distribution (indicating 2-bit data of "01") between 1.6V to 2.0V, and a threshold voltage distribution (indicating 2-bit data of "00") between 2.8V to 3.2V. Data can be stored in four different states in one memory cell on the basis of such threshold voltage distributions.

Figure 3:
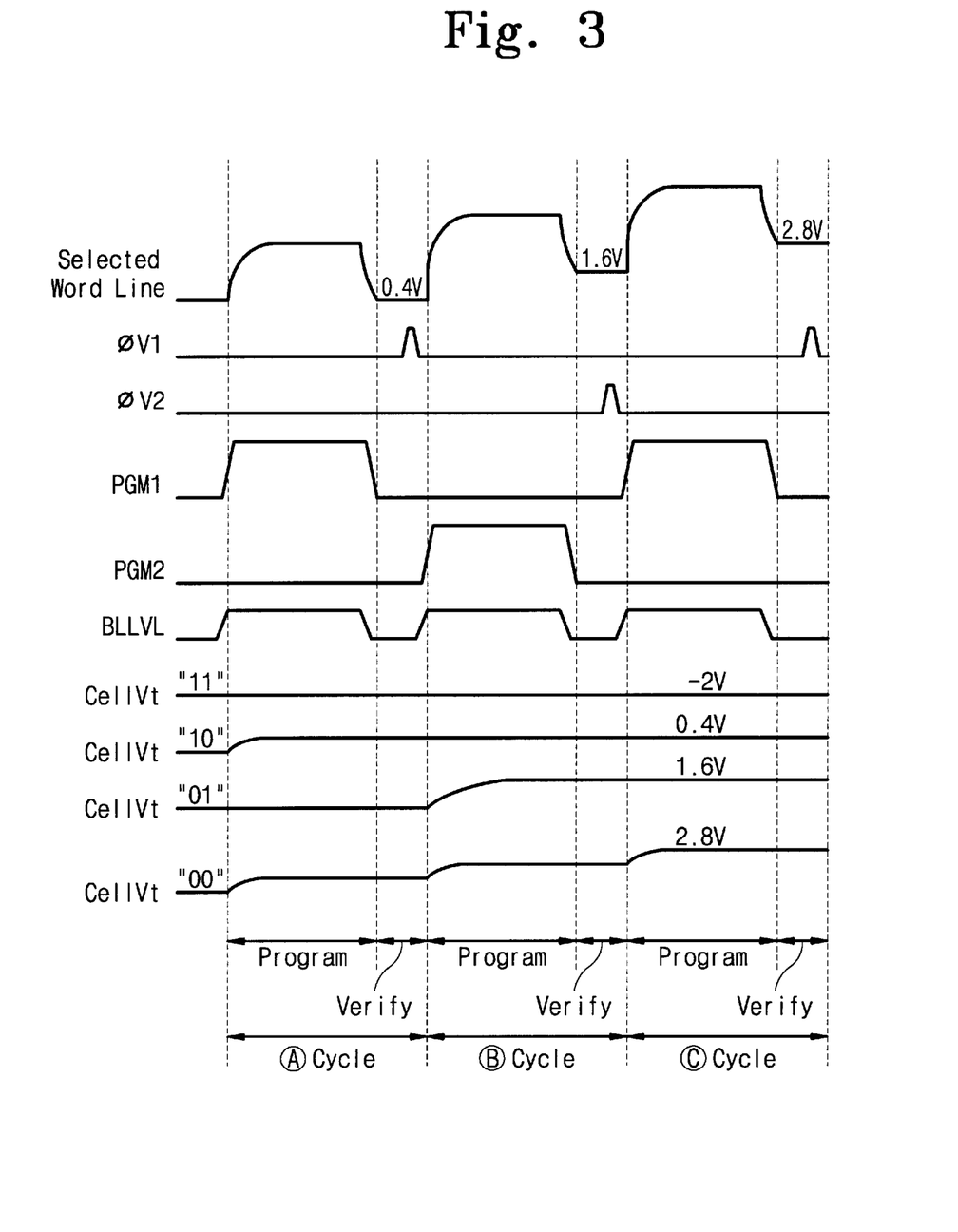
FIG. 3 is a timing diagram showing control signals associated with a program operation and a program verifying operation of the memory device in FIG. 1.
Figure 4:
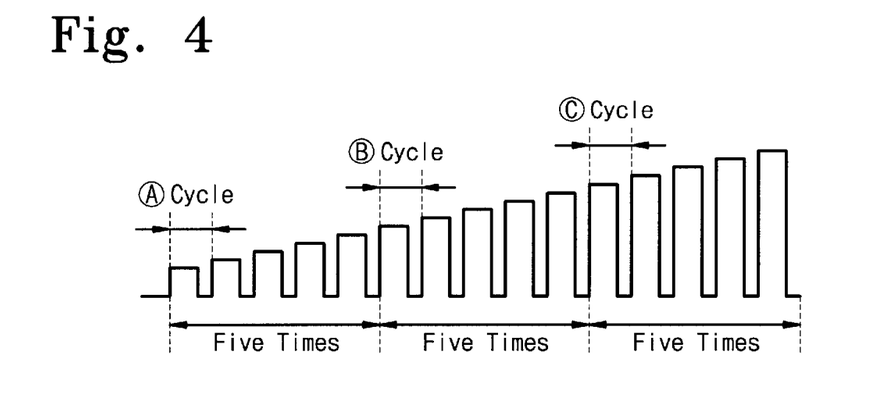
FIG. 4 is a waveform diagram showing a voltage applied to a selected word line during a program operation and a program verification operation.

Referring to FIGS. 3 and 4, waveforms of signals associated with the programming and program verifying operations are illustrated. The program cycle includes a programming operation, in which electrons are injected into floating gates of memory cells, and a program verifying operation, in which it is verified whether or not each programmed memory cell has a desired threshold voltage. The programming and program verifying operations are repeated until all the selected memory cells have desired threshold voltages. The number of times these operations are repeated may be limited to an appropriate value internally determined in the memory device. In order to execute a program utilizing Fowler Nordheim tunneling in a selected memory cell, a high voltage as a predetermined program voltage (for example, 14 to 19V) is applied to the gate of the cell while the channel of the cell is maintained at the ground voltage level.

Accordingly, a relatively strong electric field is exerted between the floating gate and channel. By virtue of such an electric field, a tunneling occurs between the floating gate and channel through an oxide film formed between the floating gate and channel. Electrons existing in the channel thus migrate toward the floating gate, so that these electrons accumulate in the floating gate. The accumulation of electrons in the floating gate results in an increase in the threshold voltage of the cell. In the case of a memory device consisting of a plurality of data cells, programming operations for the data cells are not individually carried out, but simultaneously carried out. However, the memory cells may require different threshold voltages, namely, different programmed degrees. For this reason, it may be necessary to verify whether or not the memory cells reached their desired states, after the execution of one programming operation (program verification), and to execute another programming operation for incompletely programmed memory cells without affecting the completely programmed memory cells (program inhibition). These programming and program verifying operations are repeated until all the selected memory cells reach their desired threshold voltages. In the memory device of FIG. 1, only the half of memory cells connected to a selected word line is programmed as discussed above.

The program operation and the program verification operation according to the prior art will be described with reference to the timing diagram in FIG. 3. As well known to ones skilled in the art, before the program operation, all memory cells have a negative threshold voltage by an erase scheme, which is disclosed in U.S. Pat. No. 5,841,721 under the title of "MULTI-BLOCK ERASE AND VERIFICATION IN A NONVOLATILE SEMICONDUCTOR MEMORY DEVICE AND A METHOD THEREOF".

When one of two bit lines is selected in accordance with the bit line selection signals A9 and A9b, the supply voltage Vcc from the line BLLVL is applied to the unselected bit line, thereby inhibiting the memory cells associated with the unselected bit line but connected to the selected word line from being programmed. This programming inhibit technique including the application of a supply voltage to unselected bit lines will be understood by those having skill in the art.

Data to be programmed is loaded at latches Q2 and Q1 associated with the selected bit line BL1. Assume that data of "00" is loaded on the latches Q2 and Q1. Under this condition, if a first program cycle (a) commences, a signal PGM1 for selecting the latch Q1 transitions from a logic low level to a logic high level. Thus, the select bit line BL1 has a ground voltage level through a transistor T1-16. A high voltage is applied to a word line to which a selected memory cell is connected. After a time elapses, there is performed the program verification operation for verifying whether the selected memory cell is programmed up to a desired threshold voltage (for example, 0.4V to 0.8V).

Figure 6A:
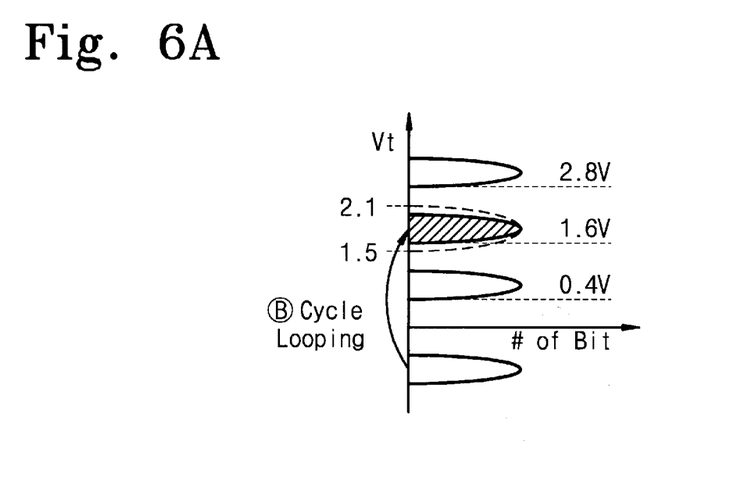
Figure 6B:
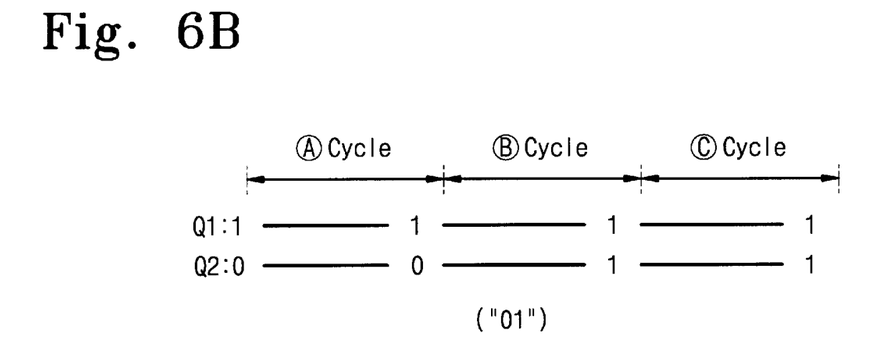
Figure 6C:
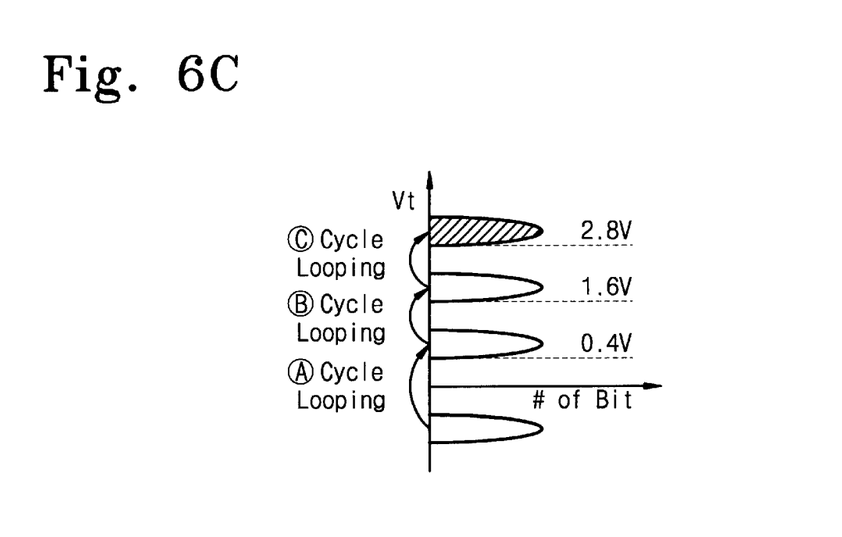
Figure 6D:
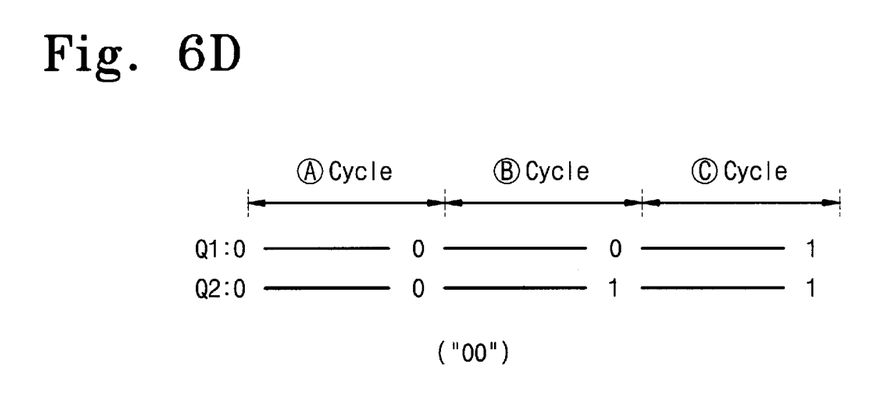

When a sensing operation for program verification is executed, signals PGM1, PGM2 and PGM3 are maintained at a logic low level, respectively. If the selected memory cell is not programmed sufficiently, the bit line BL1 continues to be maintained at the ground voltage level as a result of the sensing operation. At this time, since logic states of the selected bit line BL1 and the latch Q1 are at a logic low level, transistors T1-19 and T1-20 are turned off. Thus, as illustrated in FIG. 3, a logic state of the latch Q1 is not inverted even if a latch activation signal ϕV1 is activated with a pulse form in a program verification period. The program operation and the program verification operation related to the latch Q1 are iterated by a predetermined program frequency or until the selected memory cell is sufficiently programmed. After the first program cycle (a) is ended, the selected memory cell has a threshold voltage distribution of 0.4V to 0.8V corresponding to "10", as illustrated in FIGS. 6c and 6d.

If a second program cycle (b) of FIG. 3 commences, a signal PGM2 for selecting the latch Q2 having '0' transitions from a logic low level to a logic high level. The selected bit line BL1 has the ground voltage level through a transistor T1-14. A high voltage is applied to the selected word line to which the selected memory cell is connected. After a time elapses, there is executed the program verification operation for verifying whether the selected memory cell is programmed up to a desired threshold voltage (for example, 1.6V to 2.0V).

When a sensing operation for program verification is executed, the signals PGM1, PGM2 and PGM3 are maintained at a logic low level, respectively. If the selected memory cell is programmed sufficiently, the bit line BL1 continues to be maintained at the supply voltage level as a result of the sensing operation, to thereby turn on a transistor T1-17. If a latch activation signal ϕV2, as illustrated in FIG. 3, is activated with a pulse form in a program verification period of the second program cycle (b), a logic state of the latch Q2 is inverted into "1" from "0". On the other hand, if the selected memory cell is not programmed sufficiently, the selected bit line BL1 is maintained at the ground voltage level, thus the state of the latch Q2 is not inverted. In this case, the program operation and the program verification operation associated with the latch Q2 are iterated by a predetermined program frequency or until the selected memory cell is sufficiently programmed. After the second program cycle (b) is ended, the selected memory cell has a threshold voltage distribution of 1.6V to 2.0V corresponding to "01", as illustrated in FIGS. 6c and 6d.

Finally, if a third program cycle (c) of FIG. 3 commences, the signal PGM1 for selecting the latch Q1 having '0' transitions from a logic low level to a logic high level. The selected bit line BL1 has the ground voltage level through a transistor T1-16. A high voltage is applied to the selected word line to which the selected memory cell is connected. After a time elapses, there is executed the program verification operation for verifying whether the selected memory cell is programmed up to a desired threshold voltage (for example, 2.8V to 3.2V).

When a sensing operation for program verification is executed, the signals PGM1, PGM2 and PGM3 are maintained at a logic low level, respectively. If the selected memory cell is programmed sufficiently, the bit line BL1 continues to be maintained at the supply voltage level as a result of the sensing operation, to thereby turn on a transistor T1-17. At this time, since the state of latch Q2 is "1", the transistor T1-20 is turned on. Thus, if the latch activation signal ϕV1, as illustrated in FIG. 3, is activated with a pulse form in a program verification period of the third program cycle (c), a logic state of the latch Q1 is inverted to "1" from "0". After the third program cycle (c) is ended, the selected memory cell has a threshold voltage distribution of 2.8V to 3.2V corresponding to "00", as illustrated in FIGS. 6c and 6d.

In the case that data of "01" is loaded on the latches Q2 and Q1, a program operation and a program verification operation are as follows. First, if a first program cycle (a) commences, the signal PGM1 for selecting the latch Q1 transitions from a logic low level to a logic high level. Thus, the select bit line BL1 has a supply voltage level through a transistor T1-16. Since the bit line BL1 is maintained at the supply voltage level of a program inhibition state, the selected memory cell is program-inhibited during the first program cycle (a). As a result, after the first program cycle (a), a threshold voltage of the selected memory cell is maintained with an erase state, that is, in a threshold voltage distribution of −3V to −2V corresponding to "11".

If a second program cycle (b) of FIG. 3 commences, the signal PGM2 for selecting the latch Q2 having '0' transitions from a logic low level to a logic high level. The selected bit line BL1 has the ground voltage level through a transistor T1-14. A high voltage is applied to the selected word line to which the selected memory cell is connected. After a time elapses, there is executed the program verification operation for verifying whether the selected memory cell is programmed up to a desired threshold voltage (for example, 1.6V to 2.0V).

When a sensing operation for program verification is executed, the signals PGM1, PGM2 and PGM3 are maintained at a logic low level, respectively. If the selected memory cell is programmed sufficiently, the bit line BL1 continues to be maintained at the supply voltage level as a result of the sensing operation, to thereby turn on a transistor T1-17. If a latch activation signal ϕV2, as illustrated in FIG. 3, is activated with a pulse form in a program verification period of the second program cycle (b), a logic state of the latch Q2 is inverted into "1" from "0". On the other hand, if the selected memory cell is not programmed sufficiently, the selected bit line BL1 is maintained at the ground voltage level, thus the state of the latch Q2 is not inverted. In this case, the program operation and the program verification operation associated with the latch Q2 are iterated by a predetermined program frequency or until the selected memory cell is sufficiently programmed. After the second program cycle (b) is ended, the selected memory cell has a threshold voltage distribution of 1.6V to 2.0V corresponding to "01", as illustrated in FIGS. 6c and 6d.

Continuously, if a third program cycle (c) of FIG. 3 commences, the signal PGM1 for selecting the latch Q1 transitions from a logic low level to a logic high level. The selected bit line BL1 has the supply voltage level through a transistor T1-16. Since the selected bit line BL1 is maintained at the supply voltage level of a program inhibition state, the selected memory cell is program-inhibited during the third program cycle (c). As a result, after the third program cycle (c) is ended, the selected memory cell has a threshold voltage distribution of 1.6V to 2.0V corresponding to "01", as illustrated in FIGS. 6c and 6d.

Figure 5A:
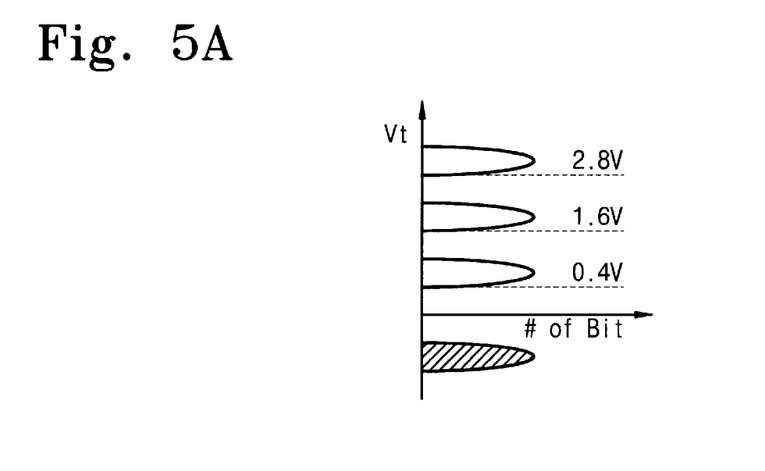
FIGS. 5 and 6 are show program data and threshold voltage variations of a memory cell during programming.
Figure 5B:
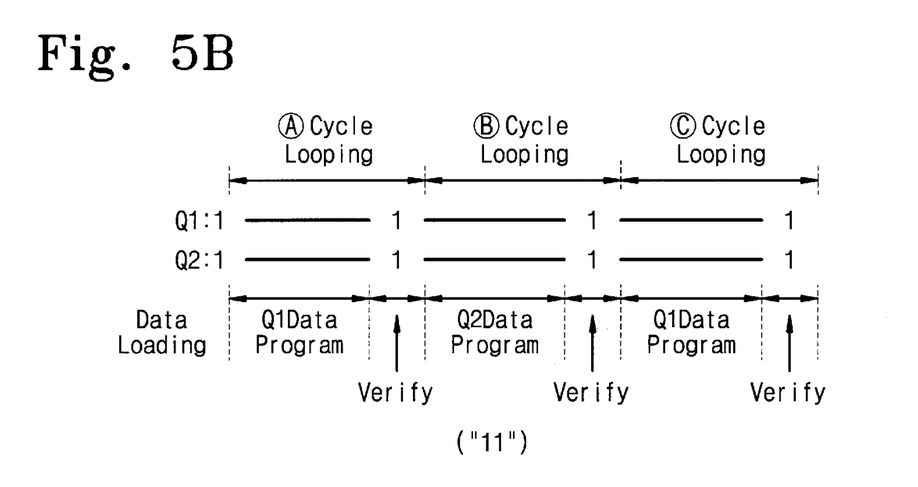
Figure 5C:
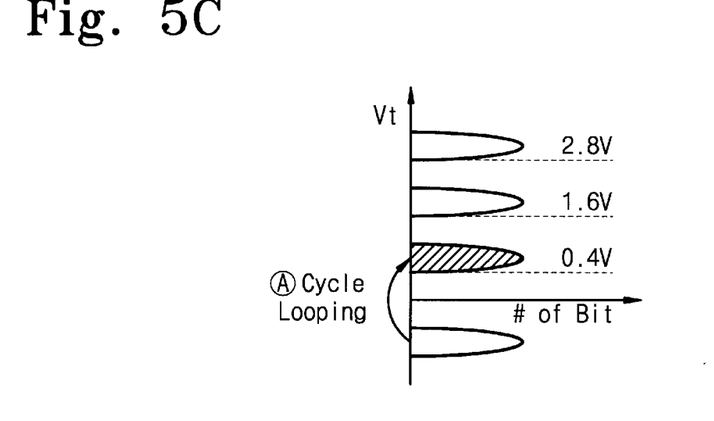
Figure 5D:
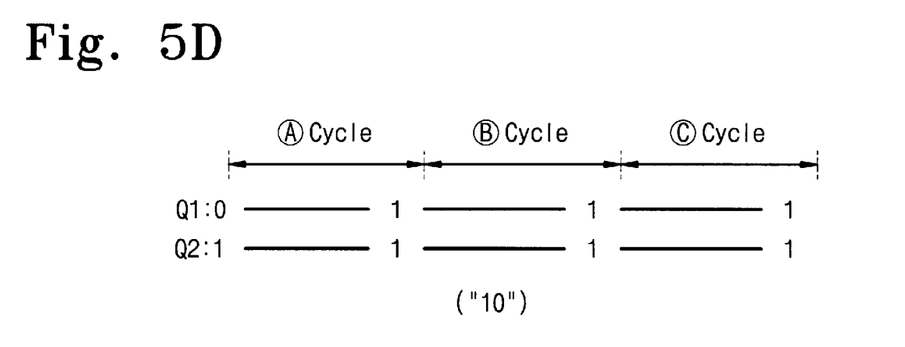

In the case that data of "11" is loaded on the latches Q2 and Q1, since the selected bit line BL1 is maintained at the supply voltage level in each of the first, second and third program cycles (a, b and c), the selected memory cell is maintained at the erased state. That is, the selected memory cell has a threshold voltage distribution of −3V to −2V, as illustrated in FIGS. 5a and 5b. In the case that data of "10" is loaded on the latched Q2 and Q1, a state of the latch Q1 is inverted into "1" from "0" as described at the program operation of "00". Thus, the selected memory cell is program-inhibited in the second and third program cycles (b and c). As a result, the selected memory cell has a threshold voltage distribution of 0.4V to 0.8V.

A variation of a threshold voltage distribution according to programmed data of a selected memory cell during the above-described program operation is illustrated in FIGS. 5 and 6. Referring to FIGS. 6a and 6b which show a threshold voltage variation of "01", since the selected memory cell is program-inhibited in the first program cycle (a), a threshold voltage of the selected memory cell is shifted from a threshold voltage distribution of −3V to −2V to a threshold voltage distribution of 1.6V to 2.0V when the second program cycle (b) is performed. That is, a threshold voltage of the selected memory cell is shifted directly into a threshold voltage distribution of "01" from a threshold voltage distribution of "11" without being shifted into a threshold voltage distribution of "10". For this, a time required to program data of "01" is longer than that of a memory cell to be programmed sequentially or gradually (for example, refer to a description for data of "00"). Therefore, as illustrated by a dot line in FIGS. 6a and 6b, a threshold voltage distribution (1.5V to 2.1V) of a memory cell to be programmed with "01" is widened as compared with a desired threshold voltage distribution (1.6V to 2.0V), thus a margin between threshold voltage distributions is reduced. For example, there is reduced a margin between a threshold voltage distribution corresponding to "10" and a threshold voltage distribution corresponding to "01", or a margin between a threshold voltage distribution corresponding to "01" and a threshold voltage distribution corresponding to "00". This causes a read fail.

SUMMARY OF THE INVENTION

It is therefore an object of the invention to provide a nonvolatile semiconductor memory device which is capable of constantly maintaining a margin between threshold voltage distributions after programming.

It is another object of the invention to provide a nonvolatile semiconductor memory device which makes a threshold voltage of a memory cell sequentially shifted into a threshold voltage corresponding to each program data when programming the memory cell up to a desired threshold voltage.

This and other objects, advantages and features of the present invention are provided by flash memory device that comprises a storage circuit for storing information (for example, two-bit data) to be programmed to a memory cell and a program data judging circuit for judging logic states of data bits stored in the storage circuit. The program data judging circuit judges whether at least one of the data bits stored in the storage circuit indicates a program of the memory cell, and sets a bit line with a program voltage (for example, a ground voltage level) or with a program inhibition voltage (for example, a supply voltage level) according to the judgment result.

By this memory device, the memory cell is able to be programmed with a desired threshold voltage at each program cycle regardless of logic states of data bits stored in the storage circuit.

BRIEF DESCRIPTION OF THE DRAWINGS

A more complete appreciation of the present invention, and many of the attendant advantages thereof, will become readily apparent as the same becomes better understood by reference to the following detailed description when considered in conjuction with the accompanying drawings in which like reference symbols indicate the same or similar components, wherein.

DESCRIPTION OF THE PREFERRED EMBODIMENT

The preferred embodiment of the invention will be more fully described with reference to the attached drawings.

Figure 7:
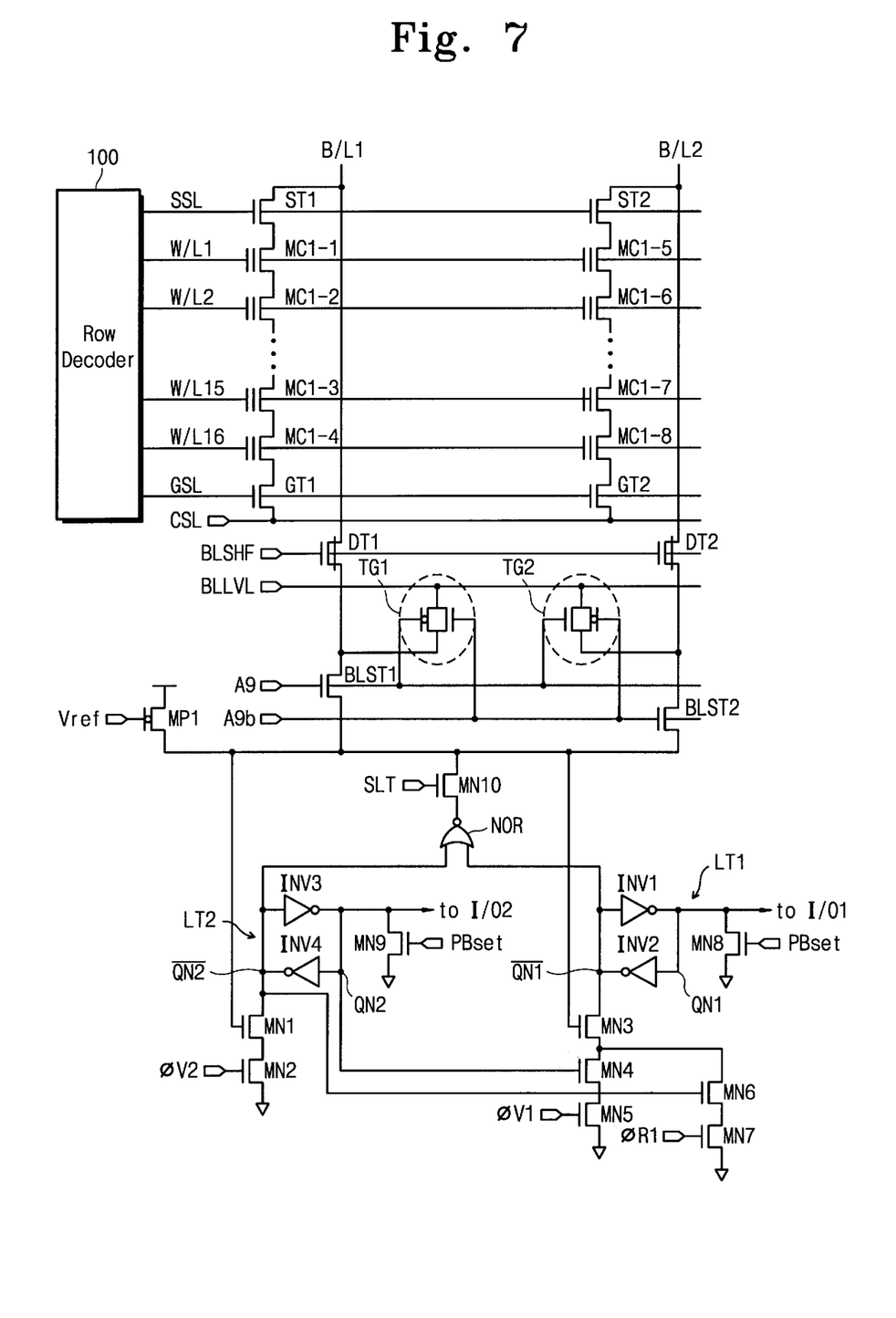
FIG. 7 shows a nonvolatile semiconductor memory device according to the present invention.

FIG. 7 is a circuit diagram showing a memory device according to the present invention that stores 2-bit information per memory cell using a NAND-type flash-EEPROM cells. The memory device in FIG. 7 comprises two memory cell strings having a plurality of serially connected memory cells. In FIG. 7, the memory cells of each string are labeled MC1-1 to MC1-4 or MC1-5 to MC1-8. String select transistors ST1 and ST2 are connected between corresponding strings and corresponding bit lines, respectively. The string select transistors ST1 and ST2 are turned on/off according to a logic state of a string select line signal SSL from a row decoder circuit 100, and electrically connect corresponding strings to corresponding bit lines, respectively. Each of ground select transistors GT1 and GT2 is arranged between a corresponding string and a common source line GSL, and is turned on/off according to a logic state of a ground select line signal GSL from the row decoder circuit 100. A depletion-type transistor DT1 or DT2 is to prevent a high voltage from being applied to a corresponding bit line.

Bit line select transistors BLST1 and BLST2 are connected to corresponding bit lines BL1 and BL2, respectively. Each of the bit line select transistors BLST1 and BLST2 selects a corresponding bit line in response to a bit line select signal A9 or A9b. A signal line BLLVL is connected to the bit lines BL1 and BL2 through corresponding transfer gates TG1 and TG2. Each transfer gate TG1 and TG2 applies a signal from the signal line BLLVL to an unselected bit line in response to the bit line select signals A9 and A9b. The signal line BLLVL supplies a program inhibition voltage (for example, a supply voltage Vcc) to the unselected bit line during programming and reading, and is maintained at a floating state during erasing. The transistors BLST1 and BLST2 and the transfer gates TG1 and TG2 constitute a bit line select circuit.

A PMOS transistor MP1 serving as a load transistor is connected in common to the bit lines BL1 and BL2 so as to supply a constant current to a selected bit line on the basis of a reference voltage Vref during reading. An example of a circuit for generating the reference voltage Vref is disclosed in U.S. Pat. No. 5,748,529 under the title of "INTEGRATED CIRCUIT MEMORY DEVICES HAVING DIRECT READ CAPABILITY", which is herein incorporated by reference.

The memory device according to the present invention further comprises latch circuits LT2 and LT1, which corresponds to the bit lines BL1 and BL2 and two latched inverters (INV1 and INV2) and (INV3 and INV4), respectively. Each of the latch circuits LT2 and LT1 latches data applied from the exterior during programming, and latches data read out from a selected memory cell during reading. Nodes QN1 and QN2 of the latch circuits LT1 and LT2, which are connected to corresponding input/output lines I/O1 and I/O2, are initialized through corresponding NMOS transistors MN8 and MN9 just before a read operation. The transistors MN8 and MN9 are turned on/off according to a logic state of an initialization signal PBset. The latches LT1 and LT2 form a storage circuit.

In the memory device of FIG. 7, a plurality of NMOS transistors MN1 to MN7 are further provided which constitute a storage control circuit. The storage control circuit inverts or maintains latch states of the latch circuits LT1 and LT2 according to a voltage level of a bit line that is selected during reading. Such a function is controlled by latch activation signals φV2, φV1 and φR1. The latch activation signals are pulsed at a point of time when an inversion of a latch state is required after a read operation commences and a time elapses.

The memory device according to a preferred embodiment of the present invention further comprises a NOR gate NOR and an NMOS transistor MN10, which form a program data judging circuit. One input terminal of the NOR gate NOR is connected to a node /QN1 of the latch circuit LT1, and the other terminal thereof is connected to a node /QN2 of the latch circuit LT2. The source of the NMOS transistor MN10 is connected to the bit lines BL1 and BL2 through the transistors BLST1 and BLST2, the drain thereof an output terminal of the NOR gate NOR and the gate thereof is connected to a signal line SLT. The signal SLT is maintained at a logic high level in a program period of each program cycle while a program operation is performed. According to this configuration, when at least one of data bits QN2 and QN1 to be programmed is at a logic low level (when a selected cell is to be programmed), a selected bit line is set to a program voltage, that is, a ground voltage level, through the NOR gate NOR and the NMOS transistor MN10 when a program operation of each program cycle is performed. When all of the data bits to be programmed are at a logic high level (when a selected cell is to be program-inhibited), the selected bit line is set to a program inhibition voltage, that is, a supply voltage, by the program data judging circuit when the program operation of each program cycle is performed.

It is obvious to form the program data judging circuit so as to perform such a function as above described, using other logic gates. Although two bit lines are illustrated in FIG. 7, more bit lines are provided. Also, it is obvious that constituent elements associated with bit lines not illustrated are configured the same as those in FIG. 7.

Figure 8:
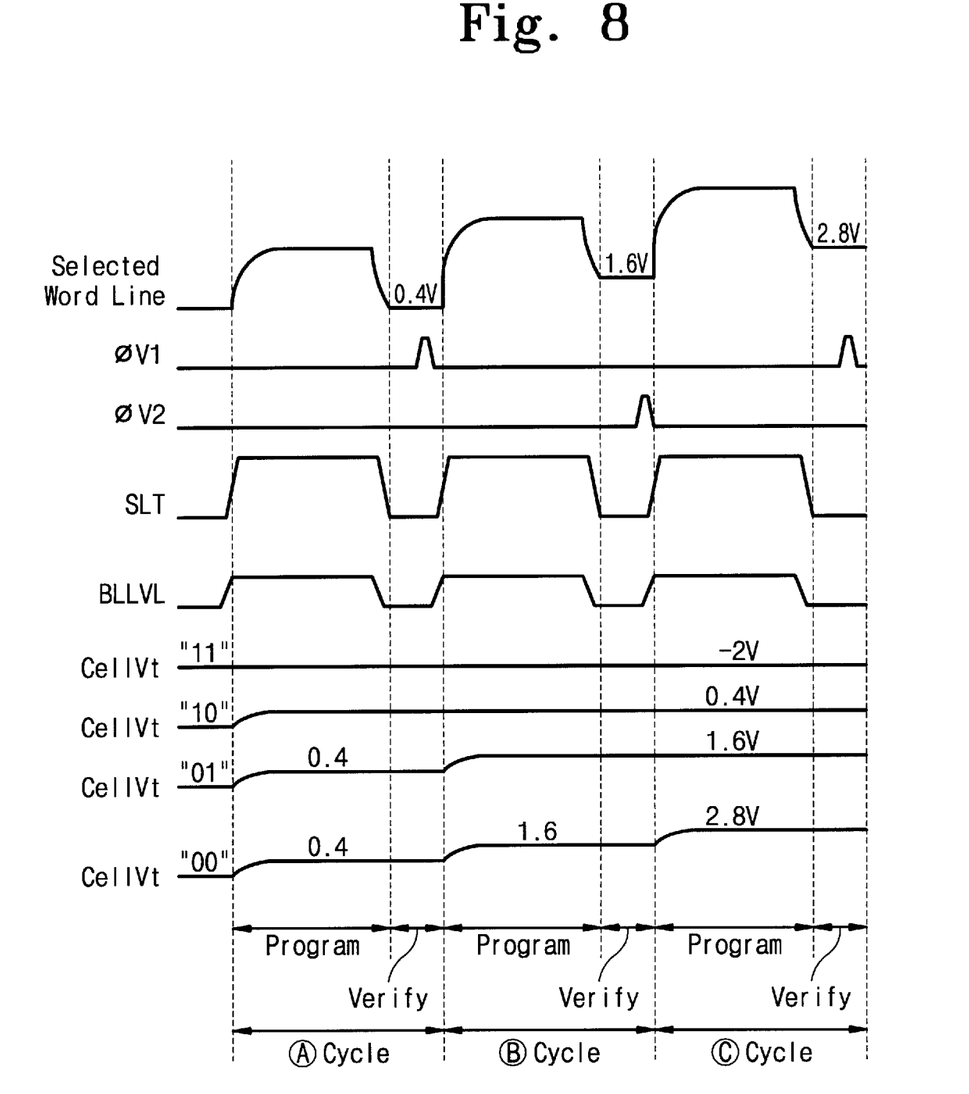
FIG. 8 is a timing diagram showing control signals associated with a program operation and a program verifying operation of the memory device in FIG. 7.

The program operation and the program verification operation of the memory device according to the present invention will be described more fully with reference to accompanying drawings. FIG. 8 is a timing diagram for describing the program operation and the program verification operation of the present invention. As well known to ones skilled in the art, all memory cells are erased by a well-known erase scheme so as to have a negative threshold voltage. After this, programming of a selected memory cell is performed as follows.

First of all, when one BL1 of the bit lines BL1 and BL2 is selected according to the bit line select signals A9 and A9b, a supply voltage Vcc is applied to an unselected bit line BL2 from the signal line BLLVL, so that a memory cell associated with the unselected bit line BL2 is program-inhibited. Data bits QN2 and QN1 to be programmed are loaded on the latch circuits LT2 and LT1 associated with the selected bit line BL1.

Program Operation and Program Verification Operation of Data "11"

Assume that data "11" is loaded on the latch circuits LT2 and LT1. Under this condition, if a first program cycle (a) commences, the signal SLT transitions from a logic low level to a logic high level, as illustrated in FIG. 8. This makes the NMOS transistor MN10 turned on, thus an output terminal of the NOR gate NOR is connected to the selected bit line BL1. Since the input terminals of the NOR gate NOR are connected to the nodes /QN2 and /QN1 having latch states of a logic low level, an output of the gate NOR goes to a logic high level. As a result, the selected bit line BL1 is set to the program inhibition voltage, that is, the supply voltage through the gate NOR and the transistor MN10.

Figure 9A:
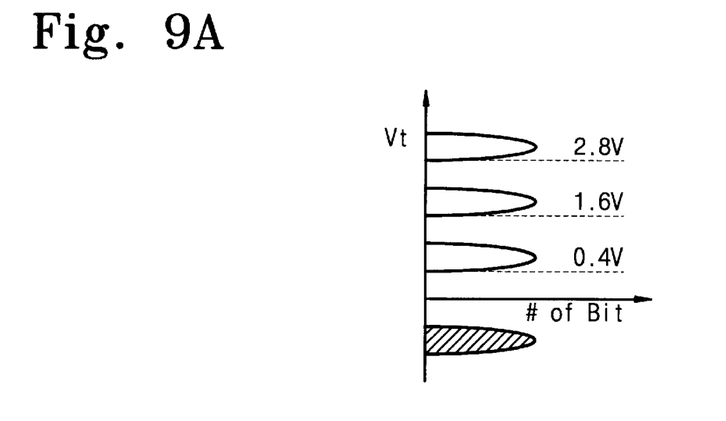
FIGS. 9 and 10 are show program data and threshold voltage variations of a memory cell during programming.
Figure 9B:
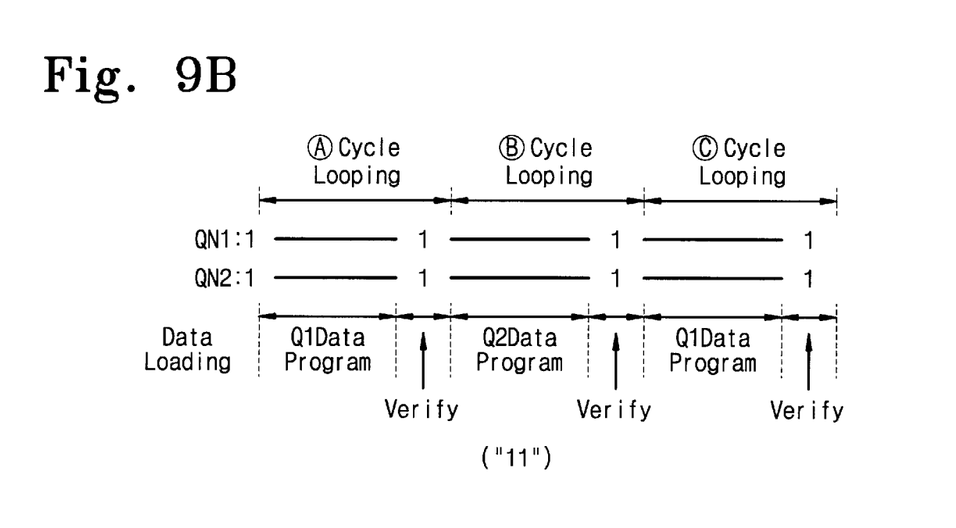

After this, a high voltage is applied to a selected word line to which a selected memory cell is connected. After a time elapses, the selected memory cell is maintained at an erased state, because the bit line BL1 has the program inhibition voltage Vcc. Therefore, as a result of a program verification operation, the nodes QN2 and QN1 of the latch circuit LT2 and LT1 are maintained at initially loaded logic states "11". Similarly to the first program cycle (a), the selected bit line BL1 has the program inhibition voltage at second and third program cycles (b and c), so that the nodes QN2 and QN1 of the latch circuit LT2 and LT1 are maintained at initially loaded logic states "11". That is, the selected memory cell has a threshold voltage corresponding to data "11", as illustrated in FIGS. 9a and 9b.

Program Operation and Program Verification Operation of Data "10"

In the case that data bits QN2 and QN1 of "10" are loaded on the latch circuits LT2 and LT1, the program and verification operations are as follows. First, when a first program cycle (a) commences, the signal SLT transitions from a logic low level to a logic high level, so that the NMOS transistor MN10 is turned on. At this time, an output terminal of the NOR gate NOR is connected to the bit line BL1. Since the input terminals of the NOR gates NOR are connected to the nodes /QN2 and /QN1 having a logic low level and a logic high level, an output of the gate NOR goes low. As a result, the selected bit line BL1 is set to a ground voltage level (that is, a program voltage) through the NOR gate and the transistor MN10. After this, a high voltage is applied to a selected word line to which a selected memory cell is connected. After a time elapses, there is performed a program verification operation for verifying whether the selected memory cell is programmed from a threshold voltage (for example, −3V to −2V) of an erased state to a desired threshold voltage (for example, 0.4V to 0.8V).

When a sensing operation for the program verification is performed, the signals SLT and BLLVL are maintained at a logic low level, respectively. If the selected memory cell is sufficiently programmed, the bit line BL1 is maintained at a supply voltage as a result of the sensing operation. Since the selected bit line BL1 and the node QN2 of the latch circuit LT2 are maintained at a supply voltage level, the transistors MN3 and MN4 are turned on. In this condition, when a latch activation signal φV1 is pulsed in a program verification period of the first program cycle (a), a logic state of the node QN1 of the latch circuit LT1 is inverted into "1" from "0".

On the other hand, if the selected memory cell is not programmed sufficiently, the bit line BL1 is maintained at a ground voltage level as a result of a sensing operation. Since the selected bit line BL1 and the node QN2 of the latch circuit LT2 have a logic low level and a logic high level, respectively, the transistor MN3 is turned off and the transistor MN4 is turned on. In this condition, although the latch activation signal φV1 is pulsed in a program verification period of the first program cycle (a), the logic state of the node QN1 of the latch circuit LT1 is not inverted. The program and verification operations related to the latch circuit LT1 are iterated until the selected memory cell is sufficiently programmed (or by a predetermined program frequency).

Figure 9C:
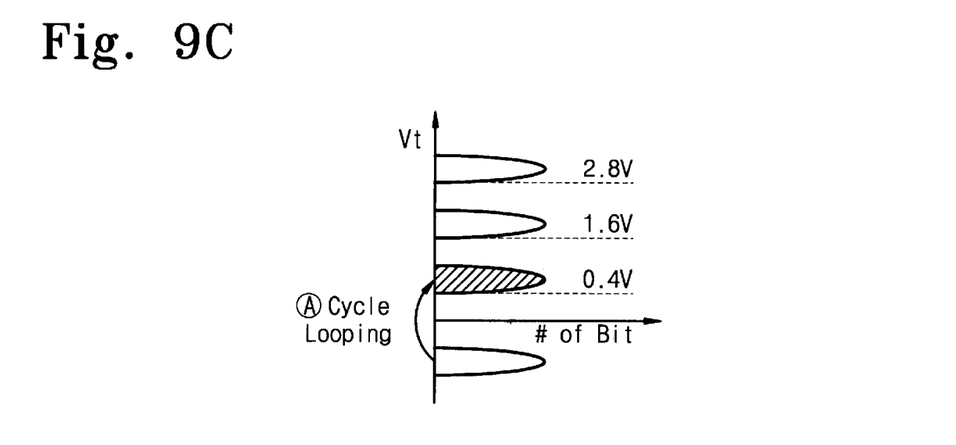
Figure 9D:
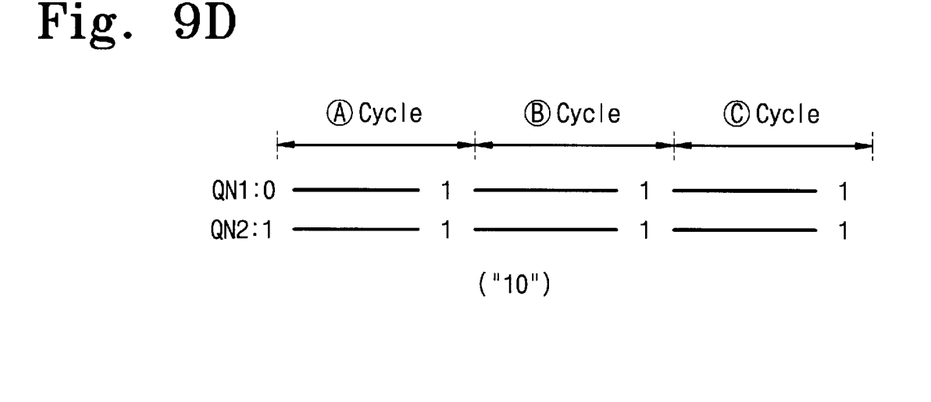

After the first program cycle (a) is completed, the latch states QN2 and QN1 of the latch circuits LT2 and LT1 are changed into "11" from "10". This forces the selected memory cell to be program-inhibited at second and third program cycles (b and c) as described above. As a result, after the first to third program cycles are performed, the selected memory cell has a threshold voltage distribution of 0.4V to 0.8V, as illustrated in FIGS. 9c and 9d.

Program Operation and Program Verification Operation of Data "10"

After data "01" is loaded on the latch circuits LT2 and LT1, a first program cycle (a) commences as a signal SLT transitions from a logic low level to a logic high level. The NMOS transistor MN10 is turned on according to a low-to-high transition of the signal SLT, so that an output terminal of the NOR gate NOR is connected to the selected bit line BL1 through the NMOS transistor BLST1. Since the nodes /QN2 and /QN1 of the latch circuits LT2 and LT1 have a logic high level and a logic low level respectively, the selected bit line BL1 has a ground voltage level. After this, a high voltage is applied to the selected word line so that the selected memory cell is programmed up to a desired threshold voltage (for example, 0.4V to 0.8V) from a threshold voltage of an erased state (for example, −3V to −2V).

Figure 10A:
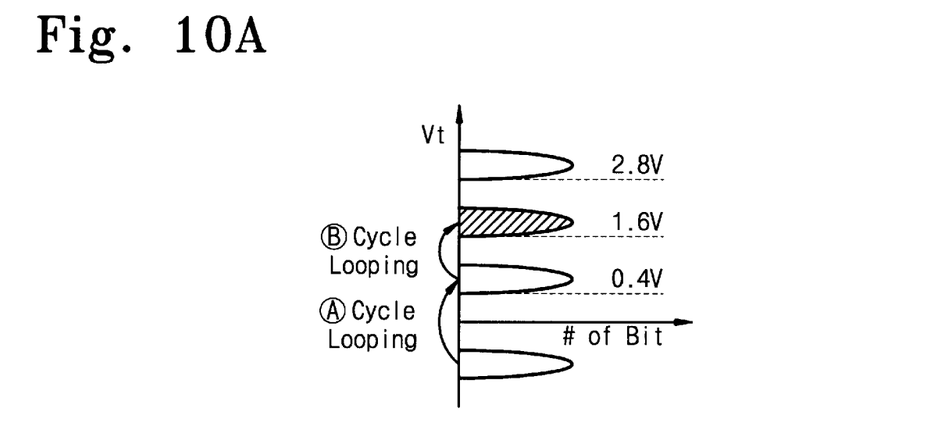
Figure 10B:
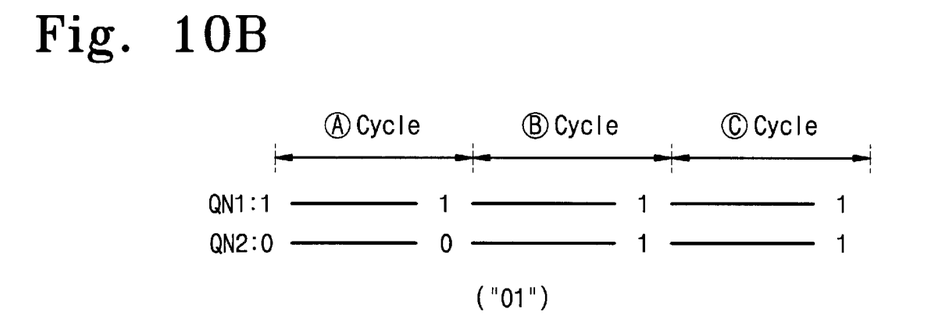

Herein, since the node QN1 of the latch circuit LT1 has a logic high level, the selected memory cell is judged as a sufficiently programmed cell at a program verification operation, which is performed at a first program cycle (a) (although not shown in the figure, judged by a well-known pass/fail judging circuit). Therefore, the program verification operation of the first program cycle (a) is not performed. After the first program cycle (a) is ended, the selected memory cell has a threshold voltage of 0.4V to 0.8V, as illustrated in FIGS. 10a and 10b.

If a second program cycle (b) associated with the data "01" commences, the NMOS transistor MN10 is turned on according to a low-to-high transition of the signal SLT. At this time, an output terminal of the NOR gate NOR is connected to the bit line BL1 through the NMOS transistor BLST1. The output of the NOR gate goes low because the input terminals of the gate NOR are connected to the nodes /QN2 and /QN1 having a logic high level and a logic low level. As a result, the bit line BL1 has a ground voltage level through the NOR gate NOR and the NMOS transistor MN10. After a high voltage is applied to the selected word line and a time elapses, there is executed a program verification operation for verifying whether the selected memory cell is programmed up to a desired threshold voltage (for example, 1.6V to 2.0V).

When a sensing operation for program verification, the signals SLT and BLLVL go low. If the selected memory cell is sufficiently programmed, the bit line BL1 has a supply voltage level as a result of the sensing operation. This makes the NMOS transistor MN1 turned on. In this condition, when a latch activation signal φV2 is pulsed in a program verification period of the second program cycle (b), a latch state QN2 of the latch circuit LT2 is inverted into "1" from "0".

On the other hand, if the selected memory cell is not programmed sufficiently, the bit line BL1 continues to be maintained at a logic low level as a result of the sensing operation. Since the bit line BL1 has a logic low level, the NMOS transistor MN1 is turned off. In this condition, although the latch activation signal φV2 is pulsed in the program verification period of the second program cycle (b), the latch state QN2 of the latch circuit LT2 is not inverted. The program and verification operations associated with the latch circuit LT2 are iterated until the selected memory cell is sufficiently programmed (or by a predetermined program frequency).

After the second program cycle (b) is completed, the latch states QN2 and QN1 of the latch circuits LT2 and LT1 are changed into "11" from "01", so that the selected memory cell is program-inhibited at a third program cycle (c). Therefore, after a set of program cycles (a, b and c) associated with the data "01" are executed, the selected memory cell has a threshold voltage distribution of 1.6V to 2.0V, as illustrated in FIGS. 10a and 10b. According to the program operation and the program verification operation associated with the data "01", as understood in FIGS. 10a and 10b, the threshold voltage of the selected memory cell is shifted to a threshold voltage distribution 0.4V to 0.8V corresponding to the data "10" at the first program cycle (a), and then is shifted to a threshold voltage distribution 1.6V to 2.0V corresponding to the data "01" at the second program cycle (b). That is, in a case of the present invention, the selected memory cell is programmed via a threshold voltage distribution corresponding to the data "10" so as to have a desired threshold voltage distribution, as compared with the prior art. A program time is prevented from being lengthened and a threshold voltage distribution is prevented from being widened, by making a threshold voltage of a memory cell sequentially shifted. As a result, there is constantly maintained a margin between threshold voltage distributions each corresponding to "10" and "01" and each corresponding to "01" and "00".

Program Operation and Program Verification Operation of Data "00"

Assume that data "00" is loaded on the latch circuits LT2 and LT1. Under this condition, if a first program cycle (a) commences, a signal SLT transitions from a logic low level to a logic high level, so that the NMOS transistor MN10 is turned on. This forces an output terminal of the NOR gate NOR to be connected to the selected bit line BL1 through the NMOS transistor BLST1. Since the nodes /QN2 and /QN1 of the latch circuits LT2 and LT1 all have a logic high level, the selected bit line BL1 has a ground voltage level. After this, a high voltage is applied to the selected word line. After a time elapses, there is performed a program verification operation for judging whether the selected memory cell is programmed from a threshold voltage of an erased state (for example, −3V to −2V) to a desired threshold voltage (for example, 0.4V to 0.8V).

Figure 10C:
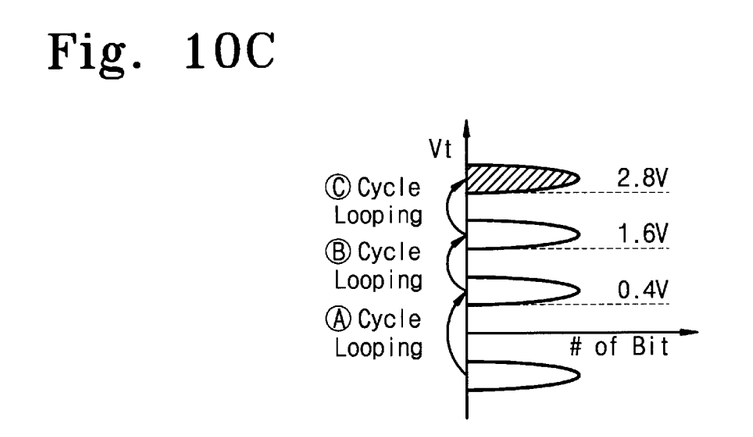
Figure 10D:
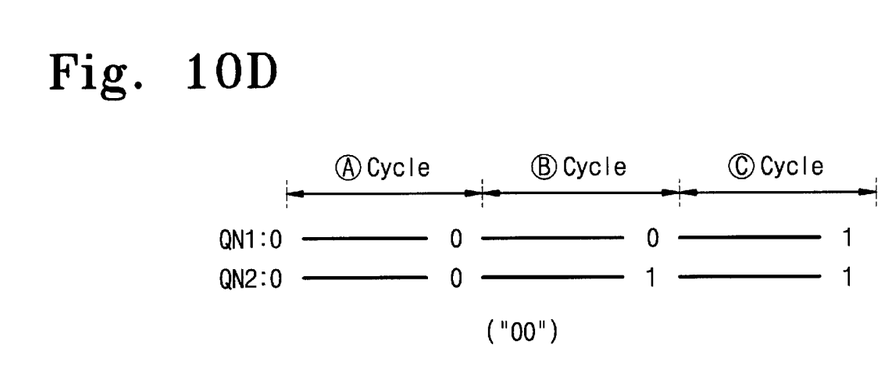

When a sensing operation for program verification, the signals SLT and BLLVL go low. If the selected memory cell is not programmed sufficiently, the bit line BL1 continues to be maintained at a logic low level as a result of the sensing operation. Since the bit line BL1 and the node QN2 of the latch circuit LT2 all have a logic low level, the NMOS transistors MN3 and 4 are turned off. Therefore, although the latch activation signal is pulsed in the program verification period of the first program cycle (a), as illustrated in FIG. 8, a latch state QN1 of the latch circuit LT1 is not inverted. The program and verification operations associated with the latch circuit LT1 are iterated until the selected memory cell is sufficiently programmed (or by a predetermined program frequency). After the first program cycle (a) is completed, the selected memory cell has a threshold voltage distribution of 0.4V to 0.8V corresponding to the data "10", as illustrated in FIGS. 10c and 10d.

If a second program cycle (b) commences, the NMOS transistor MN10 is turned on according to a low-to-high transition of the signal SLT. Similarly to the first program cycle (a), since the input terminals of the gate NOR are connected to the nodes /QN2 and /QN1 each having a logic high level, the output of the NOR gate goes low. As a result, the bit line BL1 has a ground voltage level through the NOR gate NOR and the NMOS transistor MN10. After a high voltage is applied to the selected word line and a time elapses, there is executed a program verification operation for verifying whether the selected memory cell is programmed up to a desired threshold voltage (for example, 1.6V to 2.0V).

When a sensing operation for program verification, the signals SLT and BLLVL go low. If the selected memory cell is not programmed sufficiently, the bit line BL1 continues to be maintained at a logic low level as a result of the sensing operation. Since the bit line BL1 has a logic low level, the NMOS transistor MN1 is turned off. In this condition, although the latch activation signal φV2 is pulsed in the program verification period of the second program cycle (b), the logic state QN2 of the latch circuit LT2 is not inverted. The program and verification operations associated with the latch circuit LT2 are iterated until the selected memory cell is sufficiently programmed (or by a predetermined program frequency).

On the other hand, if the selected memory cell is sufficiently programmed, the bit line BL1 has a supply voltage level, so that the NMOS transistor MN1 is turned on. When a latch activation signal φV2 is pulsed in a program verification period of the second program cycle (b), a latch state QN2 of the latch circuit LT2 is inverted into "1" from "0". That is, after the second program cycle (b) is completed, latch states QN2 and QN1 of the latch circuits LT2 and LT1 are changed into "10" from "00", so that the selected memory cell has a threshold voltage distribution of 1.6V to 2.0V, as illustrated in FIGS. 10c and 10d.

Finally, if a third program cycle (c) commences, the NMOS transistor MN10 is turned on according to a low-to-high transition of the signal SLT. Since the input terminals of the gate NOR are connected to the nodes /QN2 and /QN1 each having a logic low level and a logic high level, the output of the NOR gate goes low. As a result, the bit line BL1 has a ground voltage level through the NOR gate NOR and the NMOS transistor MN10. After a high voltage is applied to the selected word line and a time elapses, there is executed a program verification operation for verifying whether the selected memory cell is programmed up to a desired threshold voltage (for example, 2.8V to 3.2V).

When a sensing operation for program verification, the signals SLT and BLLVL go low. If the selected memory cell is not programmed sufficiently, the bit line BL1 continues to be maintained at a logic low level. Since the bit line BL1 has a logic low level, the NMOS transistor MN1 is turned off. In this condition, although the latch activation signal φV1 is pulsed in the program verification period of the third program cycle (c), the logic state QN1 of the latch circuit LT1 is not inverted. The program and verification operations associated with the latch circuit LT1 are iterated until the selected memory cell is sufficiently programmed (or by a predetermined program frequency).

In the case that the selected memory cell is sufficiently programmed, the bit line BL1 has a supply voltage level, so that the NMOS transistor MN3 is turned on. Since a logic state of the node QN2 is changed into "1" from "0" at a previous program cycle (b), the NMOS transistor MN4 is also turned on. In this condition, when a latch activation signal φV1 is pulsed in a program verification period of the third program cycle (c), a latch state QN1 of the latch circuit LT1 is inverted into "1" from "0". As a result, after the third program cycle (c) is completed, latch states QN2 and QN1 of the latch circuits LT2 and LT1 are changed into "10" from "00", so that the selected memory cell has a threshold voltage distribution of 2.8V to 3.2V, as illustrated in FIGS. 10c and 10d.

As described above, when programming a selected cell from a threshold voltage of an erased state to a target threshold voltage, the selected cell is sequentially programmed via threshold voltages between the threshold voltage of the erased state and the target threshold voltage. Therefore, the memory device of the present invention prevents a program time from being lengthened and a target threshold voltage distribution from being widened. As a result, a margin between threshold voltage distributions is constantly maintained.

The memory device according to the present invention can be realized using mask ROMs, EPROMs and EEPROMs, and can be extended so as to store data of three or more bits per cell. Furthermore, the memory device of the present invention can be applied to a scheme wherein a memory cell is programmed from a higher threshold voltage to a lower threshold voltage.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A nonvolatile semiconductor memory device comprising:
   a bit line;
   a plurality of word lines arranged orthogonally with respect to the bit line;
   a plurality of memory cells arranged at intersections of the bit line and the word lines;
   a storage circuit for latching data, the storage circuit having at least two latches, each latch being coupled to a corresponding input/output line; and a program data discriminating circuit for setting the bit line to one of a program voltage and a program inhibit voltage distinct from the program voltage during a program operation, depending on logic states of the data latched in the latches.

2. The device of claim 1, wherein the program data discriminating circuit:

sets the bit line to the program voltage when at least one of the logic states of the latched data in the respective latches indicates the program of a selected memory cell, and sets the bit line to the program inhibit voltage when the logic states of the latched data in the respective latches indicate the program inhibit of the selected memory cell.

3. The device of claim 2, wherein the program data discriminating circuit comprises:

a NOR gate which has input terminals each receiving the data in the respective latches and an output terminal; and a switch transistor which is coupled between the bit line and the output terminal of the NOR gate, and is switched on/off in accordance with a control signal, wherein the control signal is activated only during the program operation.

4. The device of claim 2, further comprising:

a load transistor coupled between a power supply voltage and the bit line, wherein the load transistor supplies a constant current to the bit line in response to a reference voltage during a program verify operation; and a storage control circuit for either inverting or maintaining logic states of the data latched in the storage circuit in accordance with a voltage level of the bit line in response to latch enable signals during the program verify operation.

5. The device of claim 4, further comprising:

another bit line arranged orthogonally with respect to the word lines; and a bit line selecting circuit for selecting one of the bit lines in response to bit line selection signals, wherein an unselected bit line is biased with the power supply voltage by means of the bit line selecting circuit during the program and program verify operations, and the selected bit line is set to one of the program voltage and the program inhibit voltage via the program data discriminating circuit in accordance with the logic states of the latched data in the latches during the program operation.

6. The device of claim 5, wherein the program voltage has a ground voltage level, and the program inhibit voltage has the power supply voltage level.

7. The device of claim 5, further comprising:

initialization transistors each coupled to the latches, for program inhibit voltage when all of the data bits in the storage circuit indicate the program inhibit of the selected memory cell.

8. The device of claim 5, wherein the data bits latched in the latches are programmed in a selected memory cell during a set of program cycles each of which is composed of the program operation and the program verify operation.

9. A method of a multi-state nonvolatile semiconductor memory device comprising:

loading a storage circuit with plural data bits of information to be programmed in a selected memory cell;

discriminating whether at least one of the data bits in the storage circuit indicates the program of the selected memory cell; and setting a selected bit line to a program voltage when the at least one data bit indicates the program of the selected memory cell, and to a program inhibit voltage when all of the data bits in the storage circuit indicate the program inhibit of the selected memory cell.

* * * * *